United States Patent
Lee et al.

(10) Patent No.: US 7,368,792 B2
(45) Date of Patent: May 6, 2008

(54) MOS TRANSISTOR WITH ELEVATED SOURCE/DRAIN STRUCTURE

(75) Inventors: Seung-hwan Lee, Seoul (KR); Moon-han Park, Yongin-si (KR); Hwa-sung Rhee, Sungnam-si (KR); Ho Lee, Gwangju-si (KR); Jae-yoon Yoo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 30 days.

(21) Appl. No.: 11/388,868

(22) Filed: Mar. 24, 2006

(65) Prior Publication Data

US 2006/0163558 A1 Jul. 27, 2006

Related U.S. Application Data

(62) Division of application No. 10/823,420, filed on Apr. 13, 2004, now Pat. No. 7,033,895.

(30) Foreign Application Priority Data

May 14, 2003 (KR) .................................. 03-30614

(51) Int. Cl.
*H01L 29/76* (2006.01)
(52) U.S. Cl. ................. 257/408; 257/336; 257/E21.43; 257/E21.431; 438/300
(58) Field of Classification Search ................ 257/336, 257/408, E21.43; 438/300
See application file for complete search history.

(56) References Cited

U.S. PATENT DOCUMENTS

| | | | |
|---|---|---|---|
| 5,012,306 A | 4/1991 | Tasch, Jr. et al. .......... 357/23.4 |
| 5,397,909 A * | 3/1995 | Moslehi ....................... 257/383 |
| 5,539,339 A * | 7/1996 | Van Rens ..................... 327/51 |
| 5,710,450 A | 1/1998 | Chau et al. | |
| 6,022,771 A | 2/2000 | Ma et al. ..................... 438/230 |
| 6,165,826 A | 12/2000 | Chau et al. | |
| 6,187,642 B1 | 2/2001 | Yu et al. ..................... 438/300 |

(Continued)

FOREIGN PATENT DOCUMENTS

| | | |
|---|---|---|
| CN | 1095196 C | 11/2002 |
| EP | 0 480 446 | 12/1990 |
| EP | 0 780 907 | 10/1997 |
| WO | 9620499 A1 | 7/1996 |
| WO | WO 03/075345 | 9/2003 |

OTHER PUBLICATIONS

Notice of Office Action issued on Nov. 16, 2007 for Chinese Application No. 2004/100433165 (with English-language translation).

*Primary Examiner*—Andy Huynh
(74) *Attorney, Agent, or Firm*—Mills & Onello LLP

(57) ABSTRACT

In a metal-oxide semiconductor (MOS) transistor with an elevated source/drain structure and in a method of fabricating the MOS transistor with the elevated source/drain structure using a selective epitaxy growth (SEG) process, a source/drain extension junction is formed after an epi-layer is formed, thereby preventing degradation of the source/drain junction region. In addition, the source/drain extension junction is partially overlapped by a lower portion of the gate layer, since two gate spacers are formed and two elevated source/drain layers are formed in accordance with the SEG process. This mitigates the short channel effect and reduces sheet resistance in the source/drain layers and the gate layer.

11 Claims, 3 Drawing Sheets

U.S. PATENT DOCUMENTS

| | | | |
|---|---|---|---|
| 6,235,568 B1 | 5/2001 | Murthy et al. | 438/231 |
| 6,277,677 B1 | 8/2001 | Lee | 438/142 |
| 6,326,664 B1 | 12/2001 | Chau et al. | 257/344 |
| 6,445,042 B1 | 9/2002 | Yu et al. | 257/369 |
| 6,727,543 B2 | 4/2004 | Lin | 257/314 |
| 2001/0034085 A1 | 10/2001 | Nakayama et al. | 438/140 |

\* cited by examiner

MOS TRANSISTOR WITH ELEVATED SOURCE/DRAIN STRUCTURE

RELATED APPLICATIONS

This application is a divisional of U.S. patent application Ser. No. 10/823,420, filed on Apr. 13, 2004, now U.S. Pat. No. 7,033,895 which claims priority under 35 U.S.C. § 119 to Korean Patent Application No. 10-2003-0030614, filed May 14, 2003, the contents of which are incorporated herein by reference, in their entirety.

BACKGROUND OF THE INVENTION

1. Field of the Invention

The present invention pertains, in general, to a semiconductor element and a method of fabricating the same and, more particularly, to a metal-oxide semiconductor (MOS) transistor with an elevated source/drain structure and a method of fabricating the same, using a selective epitaxial growth (SEG) process.

2. Description of the Related Art

As well-known to those skilled in the art, Field Effect Transistors (FET) have been gradually scaled down in size in accordance with the recent trend toward small-sized, lightweight, and slim electronic devices. However, as a result of the downsizing of the FETs, the corresponding effective channel lengths are reduced. This, in turn, causes an undesirable effect, referred to as the "short-channel" effect, which degrades the punch-through characteristics between a source electrode and a drain electrode of the FET.

In an attempt to avoid this problem, a shallow junction source/drain structure has been developed. According to this configuration, a source and a drain are constructed in the form of an LDD (Lightly Doped Drain) structure to suppress the short channel effect. However, such an LDD structure is limited in use, since it can be applied to only a semiconductor element with a gate line width of 0.35 µm or larger to suppress the short channel effect, and cannot be applied to a semiconductor element with a gate line width of 0.35 µm or less. This is because there is a limit to the extent to which the depth of the junction can be reduced, and thus formation of a junction in the LDD structure is impractical or impossible.

SUMMARY OF THE INVENTION

In order to avoid the above limitations of the LDD structure, the present invention provides a field effect transistor (FET) that includes an elevated source/drain junction.

In a metal-oxide semiconductor (MOS) transistor with an elevated source/drain structure and in a method of fabricating the MOS transistor with the elevated source/drain structure using a selective epitaxy growth (SEG) process, a source/drain extension junction is formed after an epi-layer is formed, thereby preventing degradation of the source/drain junction region. In addition, the source/drain extension junction is partially overlapped by a lower portion of the gate layer, since two gate spacers are formed and two elevated source/drain layers are formed in accordance with the SEG process. This mitigates the short channel effect and reduces sheet resistance in the source/drain layers and in the gate layer.

In a first aspect, the present invention is directed to a MOS transistor with an elevated source/drain structure, including a gate dielectric formed on an active region of a semiconductor substrate, and a gate electrode formed on the gate dielectric. The MOS transistor also includes a first gate spacer formed on lateral side surfaces of the gate electrode, and a first epi-layer formed on the semiconductor substrate. In this regard, a second gate spacer is formed on lateral side surfaces of the first gate spacer, and a second epi-layer is formed on the first epi-layer.

In one embodiment, the MOS transistor further includes a first gate oxide positioned between the gate electrode and the first gate spacer, and a second gate oxide positioned between the first gate spacer and the second gate spacer.

Further, the MOS transistor may further include a poly-layer positioned on the gate electrode. The poly-layer on the gate electrode is preferably wider than the width of the gate electrode. The poly-layer on the gate electrode comprises, for example, silicon or germanium.

Furthermore, the MOS transistor may further include a source/drain extension layer formed by a dopant ion-implanting process, and a deep source/drain layer formed by deeply ion-implanting the dopant in a portion of the semiconductor substrate positioned under the second epi-layer. At this time, the source/drain extension layer is positioned under the first epi-layer and partially overlapped by a lower portion of the gate electrode.

In one embodiment, the thickness of the first epi-layer is about 20 to 30% of the thickness of the resulting elevated source/drain layer. Additionally, the thickness of the second epi-layer is about 70 to 80% of the thickness of the resulting elevated source/drain layer.

In one embodiment, the first epi-layer or second epi-layer consists of silicon or silicon-germanium. Moreover, the second gate spacer is four to six times wider than the first gate spacer.

The present invention is further directed to a method of fabricating an MOS transistor with an elevated source/drain structure, including forming a gate dielectric on an active region of a semiconductor substrate and forming a gate electrode on the gate dielectric. A first gate spacer is formed on lateral side surfaces of the gate electrode. A first epi-layer is formed on the semiconductor substrate. A second gate spacer is formed on lateral side surfaces of the first gate spacer. A second epi-layer is formed on the first epi-layer.

The method may further include forming a first gate oxide before the first gate spacer is formed, and forming a second gate oxide before the second gate spacer is formed.

In one embodiment, the method further includes forming a first poly-layer on the gate electrode while the first epi-layer is formed, and forming a second poly-layer on the first poly-layer while the second epi-layer is formed.

In one embodiment, the method further includes ion-implanting a dopant in the semiconductor substrate to form a source/drain extension layer after the first epi-layer is formed, and ion-implanting a dopant in the semiconductor substrate to form a deep source/drain layer after the second epi-layer is formed.

The thickness of the first epi-layer is about 20 to 30% of the resulting thickness of the elevated source/drain layer. Additionally, the thickness of the second epi-layer is about 70 to 80% of the resulting thickness of the elevated source/drain layer.

In one embodiment, the second gate spacer is four to six times wider than the first gate spacer.

In one embodiment, the first epi-layer or second epi-layer consists of silicon. The first epi-layer or second epi-layer is grown in accordance with a low pressure chemical vapor deposition process. Particularly, the low pressure chemical vapor deposition process is conducted under 10 to 30 torr. Additionally, the first epi-layer or second epi-layer is formed using source gas, including dichlorosilane and HCl. Furthermore, the first epi-layer or second epi-layer is grown in accordance with an ultra-high vacuum chemical vapor deposition process. Particularly, the ultra-high vacuum chemical vapor deposition process is conducted under $10^{-4}$ to $10^{-5}$ torr. Additionally, the first epi-layer or second epi-layer is formed using source gas including $Si_2H_6$.

In another embodiment, the first epi-layer or second epi-layer consists of silicon-germanium. In this regard, the first epi-layer or second epi-layer is grown in accordance with the low pressure chemical vapor deposition process. Particularly, the low pressure chemical vapor deposition process is conducted under 10 to 30 torr. Additionally, the first epi-layer or second epi-layer may be grown in accordance with the ultra-high vacuum chemical vapor deposition process. At this time, the ultra-high vacuum chemical vapor deposition process is conducted under $10^{-4}$ to $10^{-5}$ torr. Furthermore, the first epi-layer or second epi-layer is formed using a source gas including dichlorosilane (DCS), HCl, and $GeH_4$.

The method may also include the step of baking the semiconductor substrate or the first epi-layer at 800 to 900° C. under a hydrogen atmosphere for one to five minutes before the first epi-layer or second epi-layer is formed.

Moreover, the source/drain layer may be formed by in-situ doping the dopant in the first epi-layer or second epi-layer during forming the first epi-layer or second epi-layer, or may be formed by ion-implanting the dopant in the first epi-layer or second epi-layer during forming the first epi-layer or second epi-layer.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

FIGS. 1 to 6 are sectional views illustrating the fabrication of an MOS transistor with an elevated source/drain structure according to the present invention.

Figure 1:
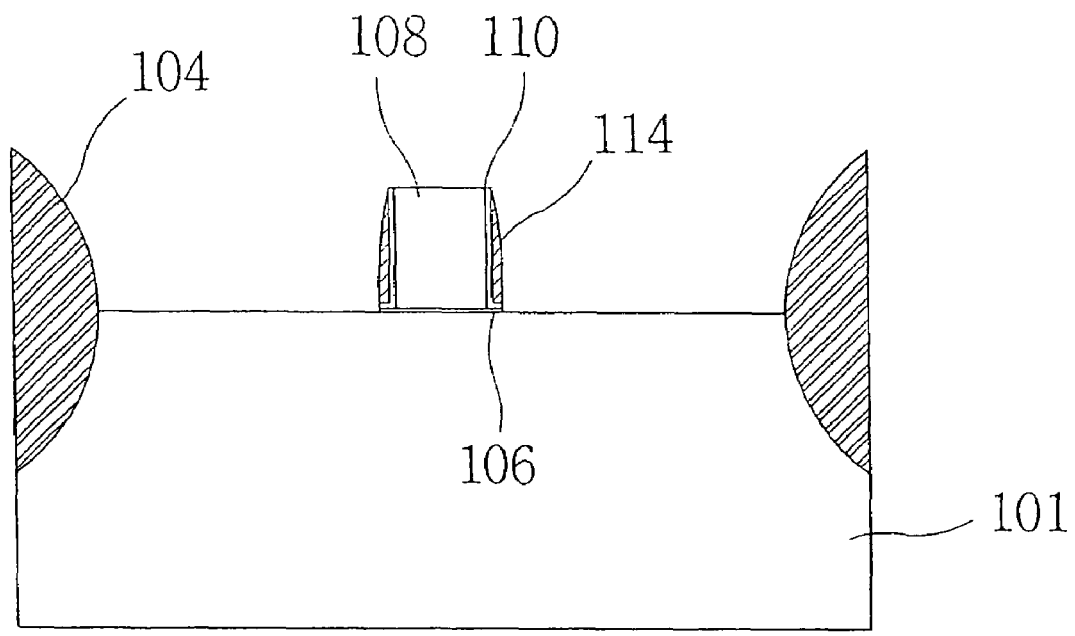
FIGS. 1 to 6 are sectional views illustrating the fabrication of a MOS transistor with an elevated source/drain structure according to the present invention.

With reference to FIG. 1, device separators 104, or isolation structures, are formed on a semiconductor substrate 101 to define an active area, or active region, between the separators 104. Preferably, the semiconductor substrate 101 is composed of silicon. The device separators may be formed, for example, by any of the well-known techniques including the formation of field oxide structures 104 according to the local oxidation of silicon (LOCOS) process, and the shallow trench isolation (STI) method.

A gate dielectric 106 is formed on the active region of the semiconductor substrate 101, for example, by a deposit of a material selected from the group consisting of $SiO_2$, SiON, SiN, $Al_2O_3$, and mixtures thereof. In one embodiment, the resulting gate dielectric 106 thus formed is 20 to 100 Å in thickness.

A conductive film for a gate electrode is then deposited on the active area of the semiconductor substrate 101 on which the gate dielectric 106 is formed, and the resulting semiconductor substrate 101 is patterned to form the gate electrode 108 structure on the semiconductor substrate 101. In this regard, in one embodiment, the material of the conductive film is selected from the group consisting of poly-silicon (poly-Si), silicon-germanium (SiGe), and germanium (Ge), and other applicable conductive materials. The gate electrode 108 is subjected to an oxidation process or a chemical vapor deposition (CVD) process to form a first gate oxide 110 on lateral surfaces, or side walls, of the gate electrode 108.

A dielectric layer, such as a nitride (e.g. SiN) layer, is then formed on the semiconductor substrate 101 according to the CVD process, and the resulting semiconductor substrate 101 is etched to form a first gate spacer 114 on the first gate oxide 110. At this time, the gate dielectric layer, other than that portion covered by a lower portion of the first gate oxide 110 surrounding the gate electrode 108 and other than that portion positioned under the first gate electrode 108 is etched in an anisotropic etching procedure, while the semiconductor substrate 101 is etched to form the first gate spacer 114.

After the formation of the first gate spacer 114, a high-temperature hydrogen baking process using hydrogen gas is conducted so as to smoothly deposit a first epi-layer 118 on the semiconductor substrate 101 in accordance with a selective epitaxial growth (SEG) process. At this time, it is preferable to conduct the hydrogen bake process at 800 to 900° C. under hydrogen atmosphere for one to five minutes.

Figure 2:
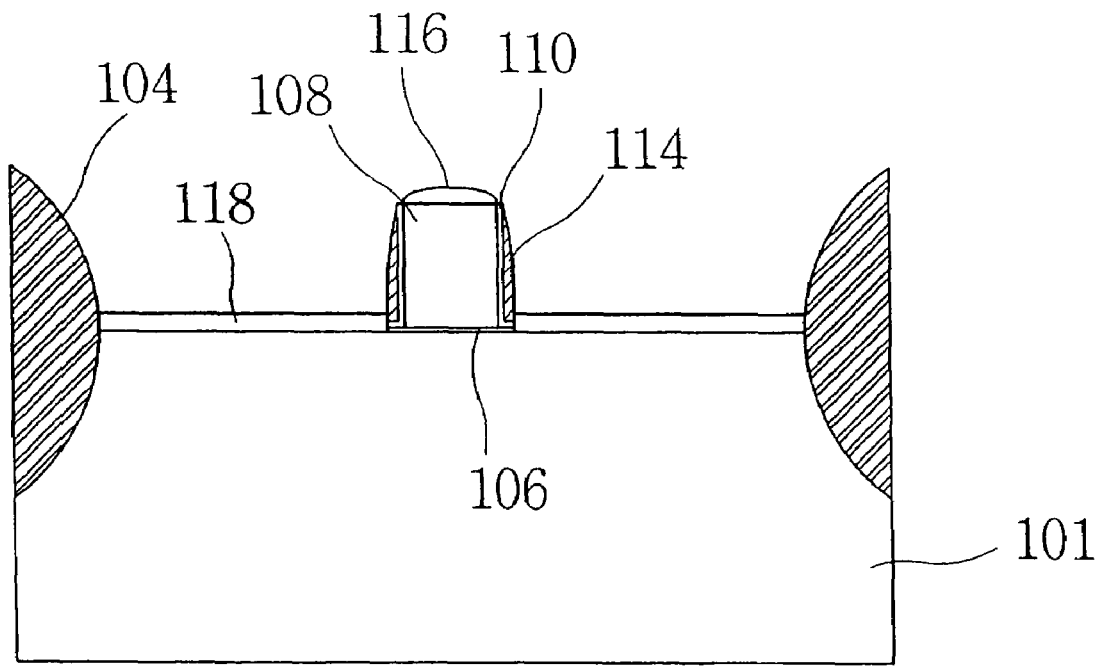

Referring to FIG. 2, the SEG process is conducted in a low-pressure chemical vapor deposition (LPCVD) or a ultra-high vacuum chemical vapor deposition (UHV-CVD) procedure to form a gate silicon 116 on the gate electrode 108 and to form the first epi-layer 118 between the field oxide 104 and the first gate spacer 114. In this regard, the first epi-layer 118 is about 20 to 30% of the resulting elevated source/drain layer, in terms of thickness. The gate silicon 116 is extended by the SEG process to form a poly-layer.

Figure 3:
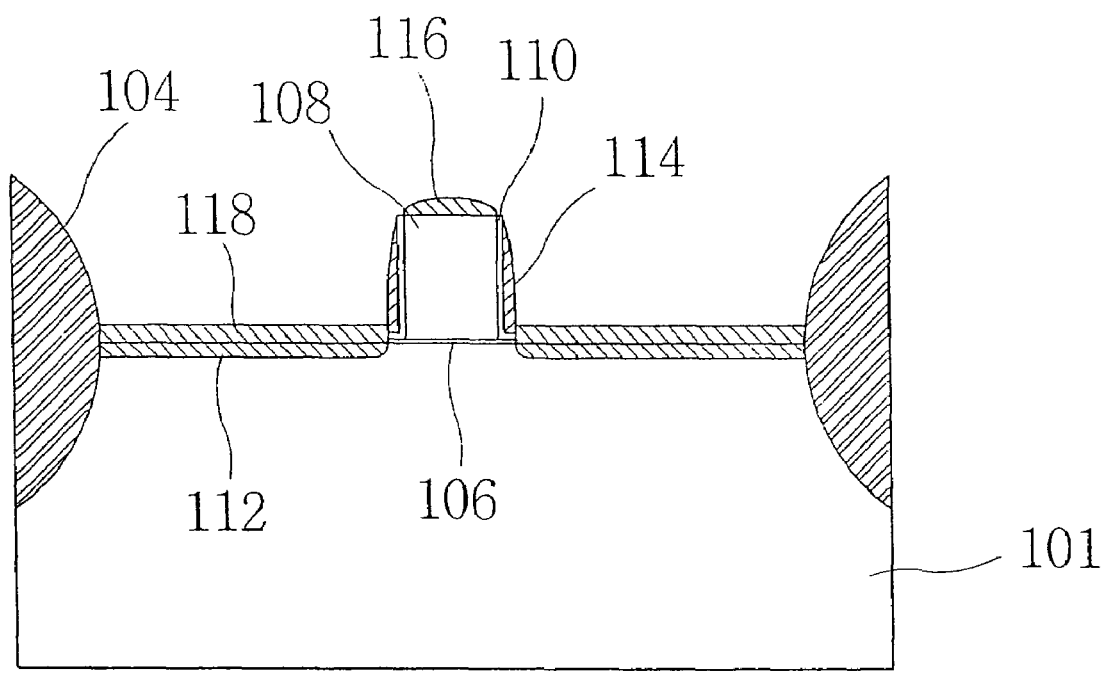

Turning to FIG. 3, a dopant is implanted in a portion of the semiconductor substrate 101 under the first epi-layer 118 at a concentration of about $10^{-14}$ ions/cm², for example $BF_2$ is ion-implanted at 3 keV in the case of PMOS (p-channel metal-oxide semiconductor) and As is ion-implanted at 10 keV in the case of NMOS (n-channel metal-oxide semiconductor) in the semiconductor substrate 101 to form a source/drain extension layer 112 in the semiconductor substrate 101.

Figure 4:
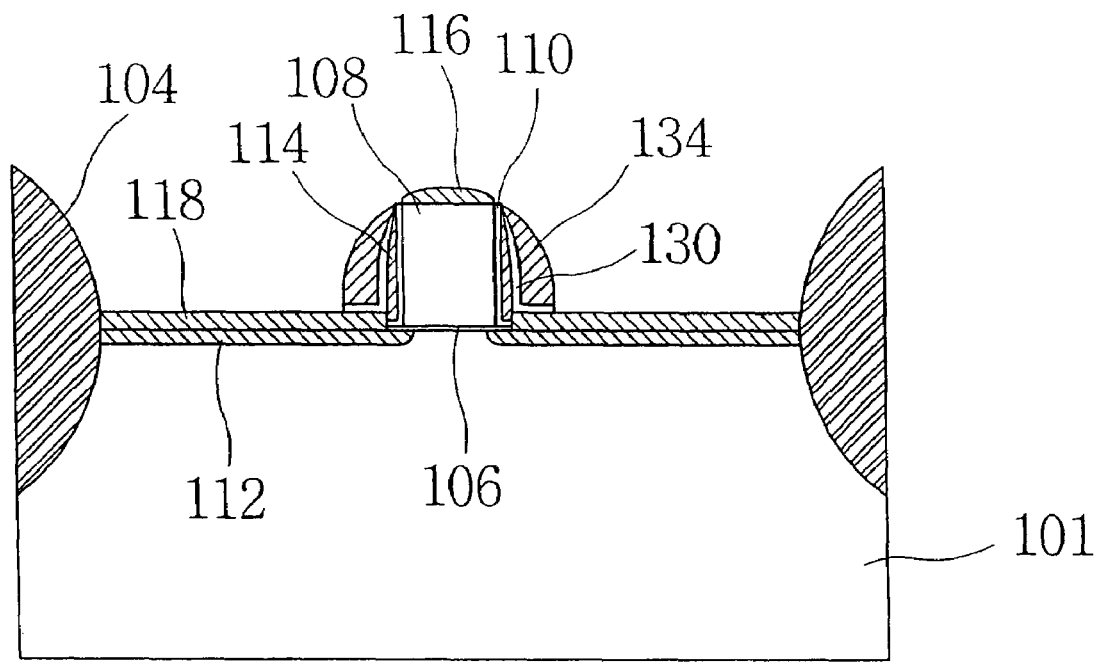

As shown in FIG. 4, a second gate oxide 130 is formed on the first gate spacer 114 in accordance with the CVD process. A dielectric, such as nitride (e.g. SiN), is then deposited on the second gate oxide 130 by the CVD process so as to construct a second gate spacer 134. Subsequently, the resulting semiconductor substrate 101 is etched to form the second gate spacer 134. At this time, it is preferable that a lateral thickness ratio of the first gate spacer 114 to the second gate spacer 134 is about 1:5.

Figure 5:
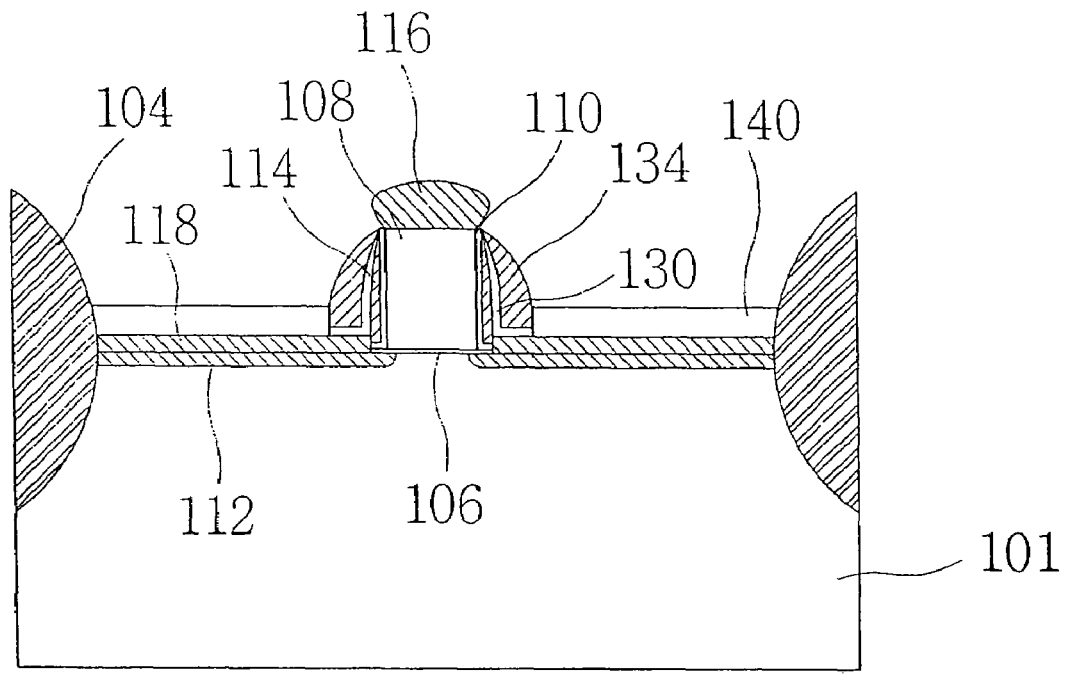

Referring to FIG. 5, the SEG process is conducted, for example using an LPCVD or UHV-CVD procedure, to form a second epi-layer 140 on the gate silicon 116 and the first epi-layer 118. In this regard, the second epi-layer 140 is about 70 to 80% of the resulting elevated source/drain layer, in terms of thickness. Accordingly, it is preferable that a thickness ratio of the first epi-layer 118 to the second epi-layer 140 is about 2:5. In the present invention, the thickness of the first epi-layer 118 is about 100 Å, and that of the second epi-layer 140 is about 250 Å.

The extended gate silicon 116 is once again extended by the SEG process of FIG. 5: As a result, the width of the poly-layer positioned on the gate electrode is larger than the width of the gate. It is preferable that the poly-layer 116 positioned on the gate electrode 108 includes silicon or germanium. Accordingly, when the gate silicon is extended in this manner, the gate resistance is reduced, and the device junction leakage property is improved because, owing to the extension, the gate silicide is farther away from the junctions.

Figure 6:
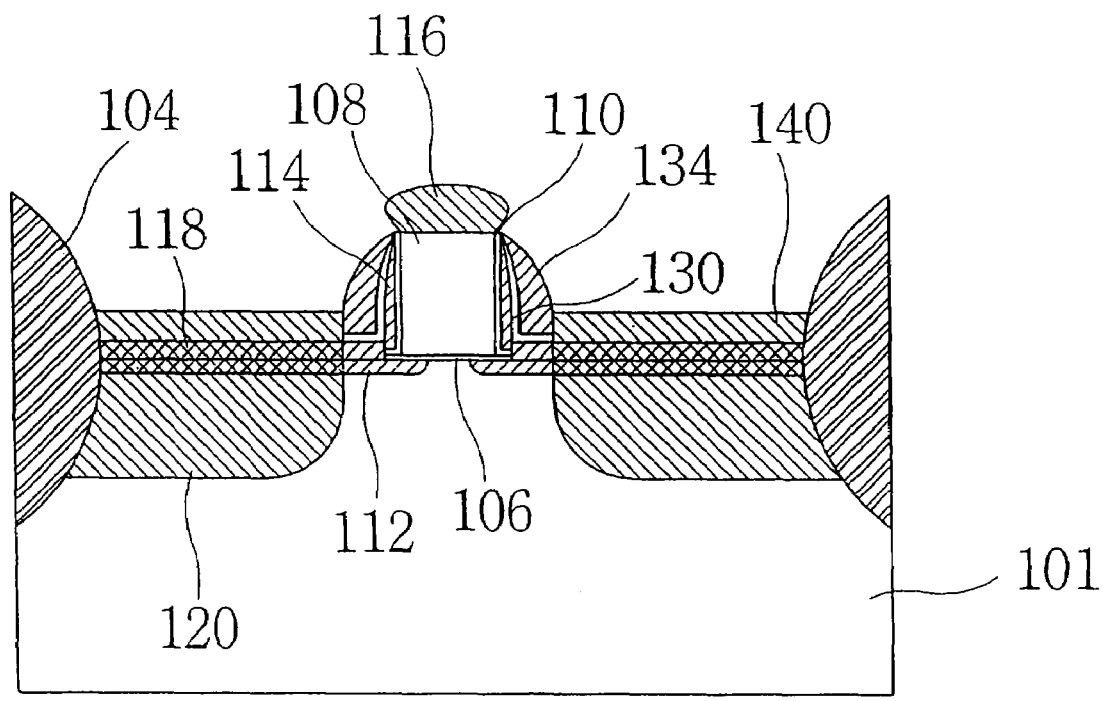

With reference to FIG. 6, the dopant is deeply ion-implanted into a portion of the semiconductor substrate 101 positioned under the second epi-layer 140 to form deep source/drain regions 120 under the source/drain electrodes, and the resulting semiconductor substrate 101 is annealed to activate the dopant ion-implanted in the semiconductor substrate 101.

Additionally, when the first or second epi-layer 118 or 140 contains silicon, the silicon epi-layer may be grown under deposition conditions with a pressure of about 10 to 30 torr and a temperature of about 850° C. using a source gas consisting of dichlorosilane (DCS) and HCl in accordance with the LPCVD process. It is preferable to grow the silicon epi-layer at deposition pressure of about 20 torr.

Alternatively, when the first or second epi-layer 118 or 140 contains silicon, the silicon epi-layer may be grown under deposition conditions of a pressure of about $10^{-4}$ to $10^{-5}$ torr and a temperature of about 600 to 700° C. using a source gas consisting of $Si_2H_6$ in accordance with the UHV-CVD process.

On the other hand, when the first or second epi-layer 118 or 140 contains silicon-germanium, the silicon-germanium epi-layer may be grown under deposition conditions with a pressure of about 20 torr and a temperature of about 650 to 750° C. using a source gas consisting of dichlorosilane (DCS), HCl, and $GeH_4$ in accordance with the LPCVD process.

Furthermore, when the first or second epi-layer 118 or 140 contains silicon-germanium, the silicon-germanium epi-layer may be grown under deposition conditions with a pressure of about $10^{-4}$ to $10^{-5}$ torr and a temperature of about 550 to 600° C. using a source gas consisting of dichlorosilane (DCS), HCl, and $GeH_4$ in accordance with the UHV-CVD process.

Meanwhile, the dopant content in the first or second epi-layer 118 or 140 may be controlled to $10^{-20}$ ions/cm² or more by in-situ doping the dopant, such as boron, phosphorous, arsenic, indium, or antimony, while growing the first or second epi-layer 118 or 140 according to the SEG process. Additionally, the dopant may be implanted into the first or second epi-layer by well-known techniques. In the case of an NMOS device, As or P is implanted at 40 keV into the first or second epi-layer, and B is implanted at 3 keV into the first or second epi-layer in the case of a PMOS device.

As described above, the present invention provides a method of fabricating a MOS transistor with an elevated source/drain structure in accordance with a selective epitaxial growth (SEG) process, in which a source/drain extension junction is formed after an epi-layer is formed, thereby preventing the short channel effect which otherwise would have been caused by the diffusion of the source/drain junctions; leakage current is therefore reduced. Furthermore, the configuration and process of the present invention are advantageous in that the source/drain extension junctions are partially overlapped by a lower portion of the gate structure, because two lateral gate spacers are formed and two elevated source/drain layers are formed in accordance with the selective epitaxial growth process, thereby preventing the short channel effect and, at the same time, reducing sheet resistance of the source/drain layer and the gate layer.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A metal-oxide semiconductor (MOS) transistor having an elevated source/drain structure, comprising:
   a gate dielectric on an active region of a semiconductor substrate;
   a gate electrode on the gate dielectric;
   a first gate spacer on a lateral side surfaces of the gate electrode;
   a first epi-layer on the semiconductor substrate;
   a second gate spacer on lateral side surfaces of the first gate spacer;
   a second epi-layer on the first epi-layer;
   a source/drain extension layer formed by a dopant ion-implanting process, said source/drain extension layer being positioned under the first epi-layer and partially overlapped by a lower portion of the gate electrode; and
   a deep source/drain layer formed by deeply ion-implanting a dopant through the second epi-layer in a portion of the semiconductor substrate positioned under the second epi-layer, a boundary of the deep source/drain layer extending from an interface between the second gate spacer and the second epi-layer in a downward direction through the first epi-layer and the semiconductor substrate.

2. The MOS transistor as set forth in claim 1, further comprising:
   a first gate oxide between the gate electrode and the first gate spacer; and
   a second gate oxide between the first gate spacer and the second gate spacer.

3. The MOS transistor as set forth in claim 1, further comprising a poly-layer on the gate electrode.

4. The MOS transistor as set forth in claim 3, wherein a width of the poly-layer on the gate electrode is wider than a width of the gate electrode.

5. The MOS transistor as set forth in claim 3, wherein the poly-layer on the gate electrode comprises silicon.

6. The MOS transistor as set forth in claim 3, wherein the poly-layer on the gate electrode comprises germanium.

7. The MOS transistor as set forth in claim 1, wherein a thickness of the first epi-layer is about 20 to 30% of a combined thickness of an elevated source/drain layer formed by the first epi-layer and the second epi-layer.

8. The MOS transistor as set forth in claim 1, wherein a thickness of the second epi-layer is about 70 to 80% of a combined thickness of an elevated source/drain layer formed by the first epi-layer and the second epi-layer.

9. The MOS transistor as set forth in claim 1, wherein at least one of the first epi-layer and second epi-layer comprises silicon.

10. The MOS transistor as set forth in claim 1, wherein the second gate spacer is four to six times wider than the first gate spacer.

11. The MOS transistor as set forth in claim 1, wherein at least one of the first epi-layer and second epi-layer comprises silicon-germanium.

* * * * *